(12) United States Patent
Ramirez

(10) Patent No.: US 9,599,638 B2
(45) Date of Patent: Mar. 21, 2017

(54) MECHANICAL SWITCH ACTIVITY DETECTION ON POWER OUTAGE

(71) Applicant: Landis+Gyr, Inc., Lafayette, IN (US)

(72) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 507 days.

(21) Appl. No.: 13/672,531

(22) Filed: Nov. 8, 2012

(65) Prior Publication Data

US 2014/0125316 A1 May 8, 2014

(51) Int. Cl.
*G01R 11/24* (2006.01)
*G01D 4/00* (2006.01)

(52) U.S. Cl.
CPC ............. *G01R 11/24* (2013.01); *G01D 4/00* (2013.01); *Y04S 20/36* (2013.01)

(58) Field of Classification Search
CPC .... G01R 22/066; G01R 21/133; G01R 22/10; G01R 22/065; G01R 22/063; G01R 11/24; G01R 11/25; G01D 4/00; G01D 4/002
USPC ........... 324/76.11, 110, 74, 156; 340/870.02; 320/104, 108, 137; 307/141; 713/330, 713/323
See application file for complete search history.

(56) References Cited

U.S. PATENT DOCUMENTS

| | | | | |
|---|---|---|---|---|
| 3,392,352 A * | 7/1968 | White | ............... | 331/111 |
| 5,953,368 A * | 9/1999 | Sanderford | ............ | G08B 25/10 375/141 |
| 6,236,197 B1 * | 5/2001 | Holdsclaw | ........... | G01R 22/066 324/110 |
| 6,246,677 B1 * | 6/2001 | Nap | ........................ | G01D 4/004 340/870.02 |
| 6,493,644 B1 * | 12/2002 | Jonker | ................. | G01R 21/133 702/182 |
| 7,571,335 B2 * | 8/2009 | Lee | ............................. | 713/330 |

(Continued)

FOREIGN PATENT DOCUMENTS

EP 1065508 A2 3/2001
EP 2503297 A2 * 9/2012

OTHER PUBLICATIONS

International Search Report and Written Opinion, PCT Application No. PCT/US2013/068976, Feb. 13, 2014, European Patent Office.

*Primary Examiner* — Huy Q Phan
*Assistant Examiner* — David Frederiksen
(74) *Attorney, Agent, or Firm* — Maginot, Moore & Beck LLP

(57) ABSTRACT

A circuit arrangement for use in a utility meter includes a mechanical switch, a processor device, and a latch circuit. The mechanical switch has a closed position and an open position, and is supported by a meter housing. The mechanical switch is operably coupled to generate a close signal when the mechanical switch is in the closed position. The processor device has a first processor input and a second processor input. The first processor input is operably coupled to receive the close signal. The latch circuit is operably coupled to receive the close signal and generate a latched signal responsive thereto. The latch circuit is configured to latch the latched signal for a predetermined time, the predetermined time corresponding to a wake-up time of the processor device. The latch circuit is operably coupled to provide the latched signal to the second processor input.

20 Claims, 7 Drawing Sheets

(56) References Cited

U.S. PATENT DOCUMENTS

| | | | | |
|---|---|---|---|---|
| 7,847,690 | B2* | 12/2010 | Murphy | 340/545.4 |
| 7,889,094 | B2* | 2/2011 | Gilbert | G01D 4/002 |
| | | | | 340/426.13 |
| 7,936,163 | B2* | 5/2011 | Lee, Jr. | 324/110 |
| 8,149,114 | B2* | 4/2012 | Hanft | 340/539.14 |
| 8,305,232 | B2* | 11/2012 | Gilbert | G01R 22/066 |
| | | | | 307/39 |
| 2003/0111911 | A1* | 6/2003 | Hsu | 307/141 |
| 2004/0073807 | A1* | 4/2004 | Youssef | G01R 22/066 |
| | | | | 713/194 |
| 2004/0114737 | A1* | 6/2004 | MacConnell | H04L 12/12 |
| | | | | 379/106.03 |
| 2006/0091877 | A1 | 5/2006 | Robinson et al. | |
| 2007/0247789 | A1 | 10/2007 | Benson et al. | |
| 2011/0115643 | A1* | 5/2011 | Gilbert | G01D 4/008 |
| | | | | 340/870.09 |
| 2012/0036250 | A1* | 2/2012 | Vaswani | G01D 4/004 |
| | | | | 709/224 |
| 2012/0074927 | A1 | 3/2012 | Ramirez | |
| 2012/0249339 | A1* | 10/2012 | Hanley et al. | 340/870.02 |

\* cited by examiner

MECHANICAL SWITCH ACTIVITY DETECTION ON POWER OUTAGE

FIELD OF THE INVENTION

The present invention relates generally to utility meters, and more specifically, to utility meters having mechanical switches.

BACKGROUND OF THE INVENTION

Electrical service providers such as electrical utilities employ electricity meters to monitor energy consumption by customers and other entities. Electricity meters track the amount of energy consumed by a load (e.g. the customer), typically measured in kilowatt-hours ("kwh"), at each customer's facility. The service provider uses the consumption information primarily for billing, but also for resource allocation planning and other purposes.

Many current electricity meters employ digital circuitry to determine energy consumption and other billing values. For example, it is known to use digital signal processors to calculate energy consumption from digital energy measurement signals. The calculated consumption information is then displayed on a meter display. From time to time, a meter reader from the utility obtains the consumption information displayed on the customer's meter display to facilitate billing. In the alternative, or in addition, the meter may include transmission capabilities for transmitting consumption information to a remote utility computing device, thereby also facilitating billing.

Electrical power is transmitted and delivered to load in many forms. For example, electrical power may be delivered as polyphase wye-connected or delta-connected power or as single phase power. Such various forms are known as service types. Different standard electricity meter types, known as meter forms, are used to measure the power consumption for the various service types. The commonly used meter forms in the United States include those designated as 2S, 3S, 5S, 45S, 6S, 36S, 9S, 16S, 12S and 25S meter forms, which are well known in the art.

As discussed above, a primary purpose of metering is to determine energy usage by a load (customer) for the purposes of accurate billing. It is therefore known that tampering with an electricity meter can result in reduced billing costs, and stolen energy. Typical tampering techniques involve either disabling the meter itself, or bypassing the meter completely. Many types of tampering involve removal of the meter cover or removal of the meter itself. Removal of the meter cover, for example, can allow for disabling or adjustment of the meter circuitry. In some cases, the circuitry may be disabled and/or adjusted and the meter cover replaced in order to mask the tamper event.

To combat energy theft via tampering, it is known to provide mechanical switch mechanisms that are triggered by cover removal, meter removal, impact, and other common operations related to tampering. Such mechanical switches generate outputs that are detected by the meter processing circuitry, which may then record the event for display or transmission to the utility.

Nevertheless, one remaining issue with tamper detection relates to power outages. In particular, electricity meters that have processing circuitry typically obtain operating power from the power lines connected to the meter. Accordingly, when a power outage occurs, primary power to the meter circuits is lost. Many meters employ temporary back-up power to allow for a graceful power down, and in some cases to allow some low level processing. Nevertheless, it is typical for one or more processing devices to be placed in "sleep" mode, which is a highly reduced state in which only a clock is maintained, and one or two inputs monitored.

In general, lack of processing during a power outage is not detrimental to the primary purpose of the meter. To this end, no energy is delivered to the customer load during a power outage, and therefore the meter need not perform normal metering operations involving the processing circuits. However, the lack of processing operations can result in inability to detect certain tampering operations. For example, if the meter cover is removed during a power outage, and replaced before power is restored, then a tamper event could go undetected because the dormant processing circuit cannot monitor the inputs associated with tamper detection switches in the meter. Accordingly, there is a need for a method of detecting tamper events during a power outage.

SUMMARY OF THE INVENTION

The present invention addresses the above-stated needs, as well as others, by providing a circuit that allows detection of a meter mechanical event during a power outage, even when the meter processing circuits are in a sleep mode or other powered down mode.

In one embodiment, a circuit arrangement for use in a utility meter includes a mechanical switch, a processor device, and a latch circuit. The mechanical switch has a closed position and an open position, and is supported by a meter housing. The mechanical switch is operably coupled to generate a close signal when the mechanical switch is in the closed position. The processor device has a first processor input and a second processor input. The first processor input is operably coupled to receive the close signal. The latch circuit is operably coupled to receive the close signal and generate a latched signal responsive thereto. The latch circuit is configured to latch the latched signal for a predetermined time, the predetermined time corresponding to a wake-up time of the processor device. The latch circuit is operably coupled to provide the latched signal to the second processor input.

In some embodiments, the mechanical switch is configured to close responsive to a cover removal event or other mechanical event that could be the result of a tampering attempt.

The above-described features and advantages, as well as others, will be readily apparent to those of ordinary skill in the art by reference to the following detailed description and accompanying drawings.

DETAILED DESCRIPTION

Figure 1:
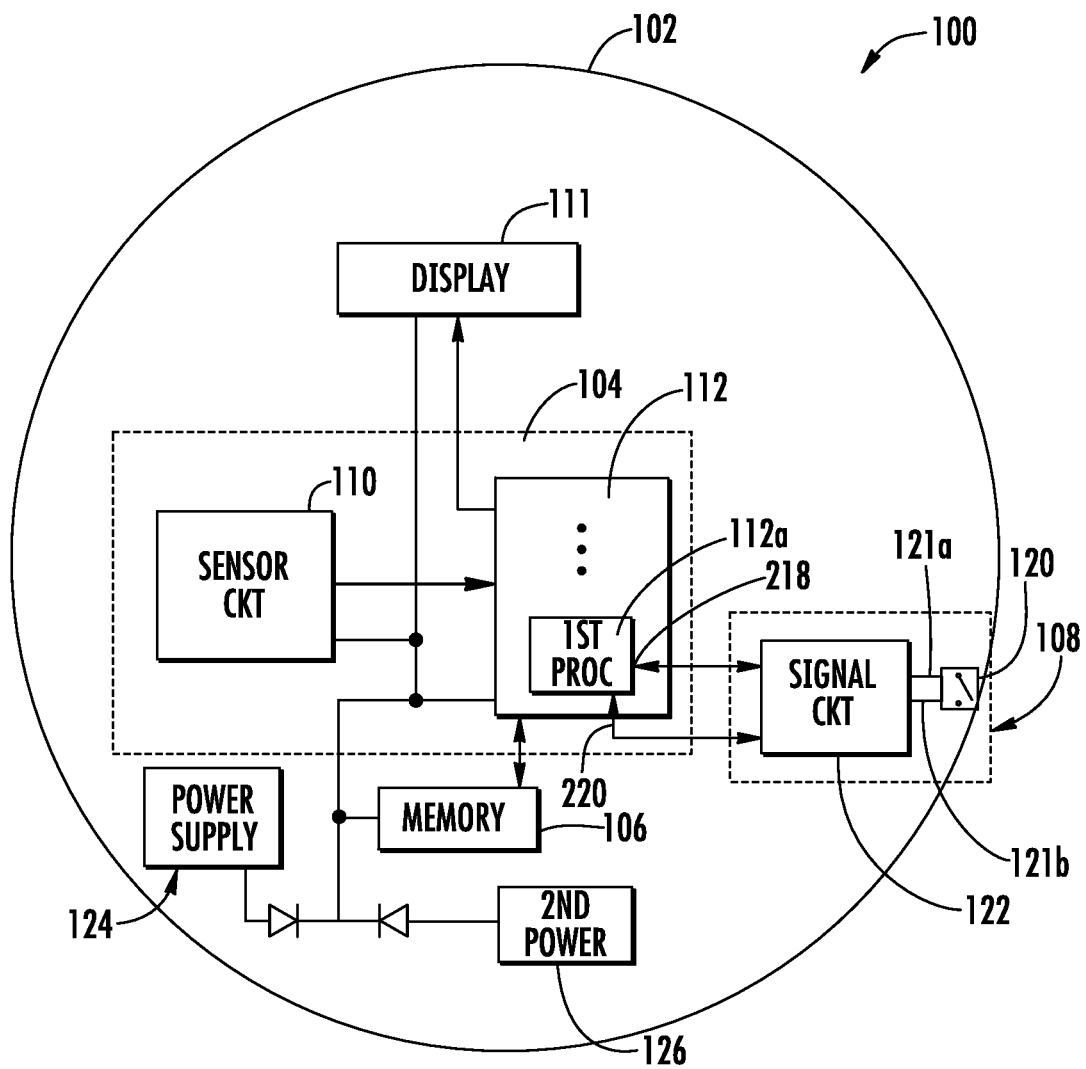
FIG. 1 shows an exemplary meter that incorporates first embodiment of the invention.

FIG. 1 shows an exemplary electricity meter 100 that incorporates an arrangement for detecting certain forms of tampering or other mechanical activity that can detect such mechanical activity during a power outage, among other times. The meter includes a meter housing 102, which supports a metrology circuit 104, a memory 106, a mechanical activity detector 108, a processing circuit 112, a power supply 124 and a secondary power source 126. The processing circuit 112 may suitably also form part of the metrology circuit 104.

Figure 2:
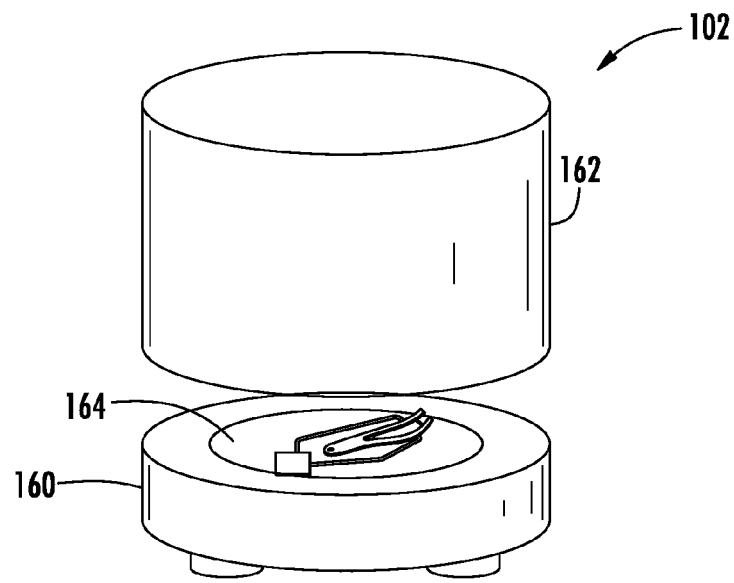
FIG. 2 shows a perspective view of the meter of FIG. 1.

The meter housing 102 further supports a display 111, which is operably connected to the processing circuit 112 in a conventional manner to display energy consumption information as well as other information. FIG. 2 shows a perspective view of the meter 100 showing the general structure of the meter housing 102. As shown in FIG. 2, the meter housing 102 includes a meter base 160 and a meter cover 162. The meter base 160 includes a circuit board 164 affixed thereto. The circuit board 164 supports and provides interconnection to many of the circuit elements shown in FIG. 1, such as the processing circuit 112, at least part of the sensor circuit 110, the power supply 124, the secondary power source 126, the memory 106 and the detector circuit 108. The meter base 160 also supports the display 111. The meter cover 162 fits over the meter base 160, and provides security and environmental protection for the internal components of the meter 100. When the meter cover 162 is installed, the internal components supported within the meter base 160 are essentially inaccessible.

Referring again to FIG. 1, the metrology circuit 104 is any suitable circuit that is configured to detect electricity delivered to the metered load, not shown in FIG. 1, and generate energy consumption-related information therefrom. Such circuits are well-known in the art. In this embodiment, the metrology circuit 104 includes a sensor circuit 110 and at least some of the functions of the processing circuit 112. The sensor circuit 110 in this embodiment includes voltage sensors and current sensors, not shown in FIG. 1, which sense electricity delivered to the load, and generate analog electricity measurement signals therefrom. The processing circuit 112 includes circuitry that converts the analog electricity measurement signals to digital measurement signals, and digital processing circuitry that calculates various energy-consumption related values based on the digital measurement signals. The processing circuit 112 may suitably include one or more processing devices, including a meter processor 112a, as is known in the art.

The memory 106 in this drawing is representative of a non-volatile memory, such as flash memory or the like. However, it will be appreciated that the memory 106 may be a set of memories that includes one or more of flash memory, non-volatile RAM, and even volatile memory. Moreover, the processing circuit 112 also includes working memory, such as RAM, as is known in the art.

The power supply 124 is a circuit that provides bias power to the processing circuit 112 and other circuit elements during normal operation of the meter 100. To this end, the power supply 124 obtains electrical energy from the utility power lines and generates the necessarily DC bias voltages for the processing circuit 112 and other circuits. Such power supplies are conventional in the metering art.

The secondary power source 126 is a circuit that provides temporary power to one or more circuits such as the processing circuit 112 on a temporary basis when utility power is not available to the power supply 124. The secondary power source 126 typically includes at least one energy storage device such as a battery and/or capacitors. U.S. patent application Ser. No. 13/464,374, which is owned by the same owner as the present application, and which is incorporated herein by reference, shows an exemplary circuit for providing temporary back-up power for metering devices.

The mechanical activity detector 108 is an arrangement of elements that is configured to detect mechanical activity, such as meter cover removal, impact forces, or meter removal, and provide suitable signals to the processing circuit 112 for recordation, display or communication of the detected mechanical event. In the exemplary embodiment described herein, the mechanical activity detector 108 is configured to detect and signal the removal of the meter cover 162 from the meter base 160. To this end, the mechanical activity detector 108 includes at least one mechanical switch 120, conductors 121a, 121b and a signal circuit 122. Although not visible in FIG. 2, the mechanical switch 120, the conductors 121a, 121b and the signal circuit 122 are all disposed on the circuit board 164. The conductors 121a, 121b may suitably be traces defined on the surface of the circuit board 164.

The mechanical switch 120 is a device including contacts that make or break electrical connection based on mechanical activity corresponding to a potential tamper event. To this end, the mechanical switch 120 is configured to make (closed) and break (open) an electrical connection between the conductors 121a, 121b. In this embodiment, the mechanical switch 120 may include a set of electrical contacts that complete a connection between the conductors 121a, 121b when the meter cover 162 is removed from (i.e. disconnected from or separated from) the meter base 160. By contrast, when the meter cover 162 is properly installed on the meter base 160, then the mechanical switch 120 breaks the connection between the conductors 121a, 121b. It will be appreciated that there are many conceivable arrangements of a switch 120 that closes when the meter cover 162 is removed and opens when the meter cover 160 is installed. The details of implementation of such an arrangement could take many forms, and would be known to those of ordinary skill in the art. The inventive features discussed herein are applicable to any such configuration.

Figure 3:
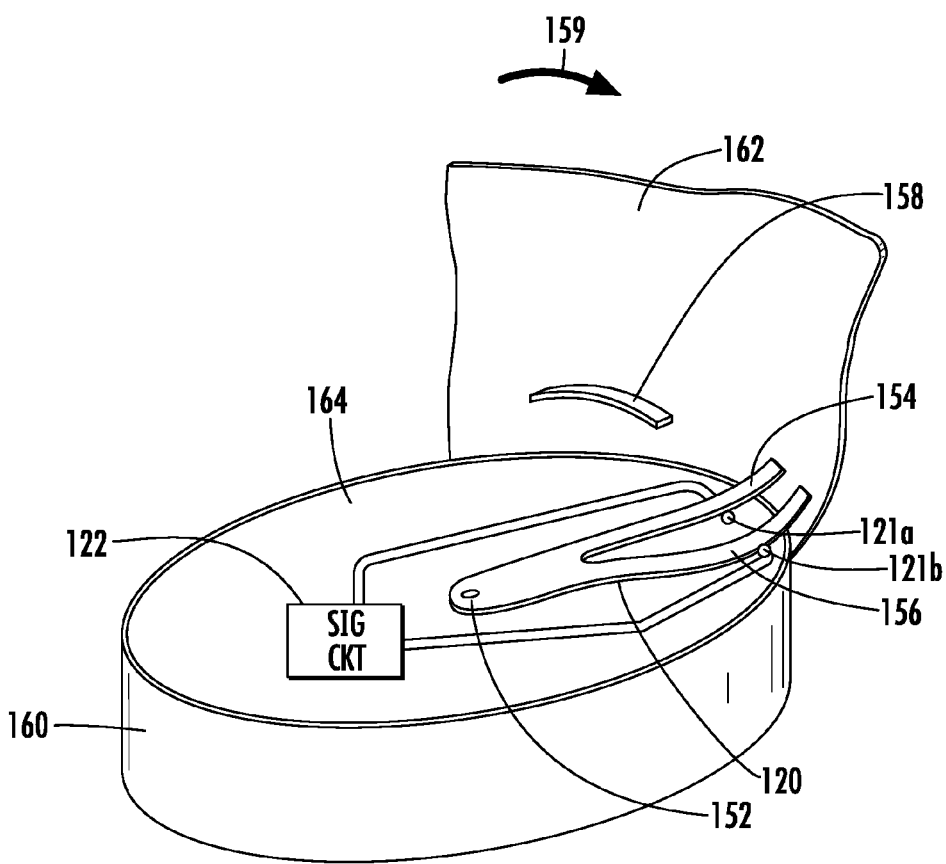
FIG. 3 shows a fragmentary perspective view of the meter of FIG. 1.

By way of example, FIG. 3 shows a representative, fragmentary perspective view of an exemplary mechanical switch 120 and corresponding arrangement for making and breaking the connection between the conductors 121a, 121b based on whether the meter cover 162 is installed on the meter base 160. Referring to FIG. 2a, the mechanical switch 120 includes a U-shaped conductor having a first end 152 coupled to the circuit board 164, and arms 154, 156 extending therefrom. The arms 154, 156 are spring-biased towards the circuit board 164, such that if unimpeded, the arms 154, 156 will mechanically and electrically contact, respectively, the conductors 121a, 121b. In FIG. 3, the cover 162 is not completely installed, and therefore the arms 154, 156 are in contact with, and complete the connection between, the conductors 121a, 121b.

The meter cover 162 in this embodiment includes an inclined inner ledge 158 that is positioned such that when the meter cover 162 is rotated into the closed position, (in the direction 159 of FIG. 3), the inner ledge 158 urges or cams the arms 154, 156 upward off of the circuit board 164, thereby breaking the connection between the conductors 121a, 121b. To this end, the ends of the arms 154, 156 extend upwards as then extend toward the inner surface of the cover 162. As a consequence, the inner ledge 158, as is rotates toward the closed position, can push the arms 154, 156 upward as the inclined surface of the inner ledge 158 continues to rotate through to the radial position of the arms 154, 156.

In yet other embodiments, another mechanical switch 120 may be one that makes contact responsive to impact forces or tilting of the meter. Such mechanical switches are known an may readily be employed within the mechanical activity detector 108 in place of, or in addition to, the switch 120.

In any event, the signal circuit 122 is a circuit that is operably connected to determine whether the conductors 121a, 121b are connected (via closed switch 120) or disconnected (via open switch 120). The signal circuit 122 is further configured to generate, responsive to the detection of a connection between the conductors 121a, 121b, two output signals. The two output signals include a first output signal and a latched output signal. The signal circuit 122 is operably connected to provide the first output signal and the latched output signal to one or more inputs of the processing circuit 112, as will be discussed below in detail.

It will be appreciated that the signal circuit 122 may alternatively be configured to generate the first output signal and the latched output signal responsive to a temporary opening of the mechanical switch 120, as opposed the temporary closing of the mechanical switch 120. In such a case, the mechanical switch 120 would be normally closed, and only opened upon detection of a mechanical event. Such an alternative, however, may require more energy from the secondary power source 126, and therefore would be less preferable.

Referring now to the processing circuit 112, in addition to the operations as part of the metrology circuit 104, the processing circuit 112 performs operations involving supervisory functions, display functions, and other functions within the meter 100. To perform all of such functions of the processing circuit 112, the processing circuit 112 includes at least a first processor 112a and in some cases multiple processors. The processor 112a in this embodiment is a 71M6533 metering integrated circuit (IC) available from Teridian. However, it will be appreciated that other processing devices may be used.

In general, the processor 112a, and hence the overall processing circuit 112, has a first mode and a second mode. In the first mode, the processor 112a performs a first set of metering operations related to energy metering, as discussed above. In the second mode, the processor 112a performs a second set of operations in the second mode, the second set of operations having fewer operations than the first set of operations. The second mode is often referred to as a sleep mode, and is a reduced power state with minimal functionality. In the second mode, the processor 112a is in the reduced power (sleep mode) state and other circuitry of the processing circuit 112 may not be powered all. Accordingly, the processing circuit 112 consumes less energy in the second mode than in the first mode.

To this end, in the first mode or "active mode", the processor 112a and other components of the processing circuit 112 receive operating bias power from the power supply 124. The processing circuit 112 operates in the active mode when utility power is available to the meter. In the second mode or "sleep mode", the processor 112a is operably connected to receive power from the secondary power source 126, and other portions of the processing circuit 112 receive no operating power. The processing circuit 112 is in the sleep mode primarily when utility power is not available to the meter 100. In the sleep mode, the first processor 112a ceases substantially all of its operations in the supervisory, display and metrology functions of the meter 100. The first processor 112a is configured to resume active mode, and such functions, upon restoration of utility power.

However, in accordance with the present invention, the processor 112a is further configured to operate in a third mode upon receiving a wake-up signal at a first input 218 from the signal circuit 122, while in the sleep mode. In this third mode, the processor 112a causes recordation of a mechanical switch event responsive to receiving a low logic signal at a second input 220 from the signal circuit 122. To this end, the processor 120a is configured to execute software instructions stored in the memory 106 or in internal memory to perform the operations ascribed to the processor 120a below.

To this end, the first processor 112a is operably coupled to receive the first output signal and the latched output signal from the signal circuit 122. Furthermore, the first processor 112a is configured to transition from the sleep mode to the active "third" mode, at least temporarily, upon receipt of the first output signal of the signal circuit 122. The processing circuit 112 is further configured to record, when in the active third mode, a flag or other memory record into the memory 116 responsive to a latched output signal received from the signal circuit 122. After recording such an event record or flag in the memory 116, the processing circuit 112 may suitably return to the sleep mode if utility power is not present. In addition, or in the alternative, the first processor 112a may display an indication of the detected event.

Referring again generally to FIGS. 1 and 2, during normal operation, the power supply 124 uses the utility power and generates biasing power for the processing circuit 112, the display 111 and other circuitry within the meter 100. Accordingly, the processing circuit 112 and the processor are in the active mode. The metrology circuit 104 operates to detect and measure electrical energy consumption (or related values) delivered from the utility power lines to the load. The processing circuit 112 assists in such energy consumption measurement and further causes energy consumption information to be displayed on the display 111. As is conventional, display of energy consumption information allows for a meter reader to obtain information used by the utility service provider for billing, as well as other purposes. In alternative embodiments, the processing circuit 112 may cause the energy consumption information to be transmitted to a remote meter reading device, not shown, via a transmission device, also not shown. The above operations are conventional in the metering industry, and may take many forms. The processor 112a may perform many or all of these functions of the processing circuit 112.

In addition, during normal operation, the meter cover 162 is installed on the base 160, and as such the mechanical switch 120 is the open state, in this embodiment. It will be appreciated that if the mechanical switch 120 is instead an impact detector or other abnormal event detector, it is also "open" during normal operation.

Because the mechanical switch 120 is in the open state, the signal circuit 122 detects that the conductors 121a, 121b are not electrically coupled. As such, the signal circuit 122 does not provide a latched output signal to the first processor 112a. However, if due to a tampering attempt such as removal of the meter cover 162 from the meter base 160 (or impact or some other mechanical phenomena in other embodiments), the mechanical switch 120 is temporarily closed, then the signal circuit 122 generates the latched output signal and provides the latched output signal to the first processor 112a. The first processor 112a stores information indicative of a detected mechanical event in the memory 106. The first processor 112a may further cause an indication of the event to be displayed on the display 111, or communicated via a communication device.

In the event of a power outage or power interruption, the power supply 124 can no longer generate bias power for the processing circuit 112, the display 111 and other circuits. Accordingly, the secondary power source 126 provides bias power to at least some of the circuits within the meter 100. However, one or more circuits of the meter 100 are disabled to conserve the power in the secondary power source 126. In this embodiment, for example, the first processor 112a goes into sleep mode. The signal circuit 122, however, is operably connected to receive power from the secondary power source 126 when the primary supply no longer generates bias power.

In such a case, as long as the meter cover 162 is installed on the meter base 160, the mechanical switch 120 remains in the open state. As a consequence, the signal circuit 122 does not generate either the first output signal or the latched output signal. However, if the meter cover 162 is removed, then the mechanical switch 120 closes. As a consequence, the signal circuit 122 provides the first output signal and the latched signal to the respective inputs 218, 220 of the processor 112a.

The first output signal is preferably provided to an input 218 on the processor 112a that causes the processor 112a to "awaken" from a sleep mode. Such inputs are known on many processors. For example, the Teridian metering IC referenced above operates to transition the Teridian meter processing chip from a low power consumption mode wherein meter calculations do not take place to a higher power consumption mode wherein meter processing occurs. In many cases such a transition from a sleep mode to an active (third) mode can take one second or more.

After the processor 112a transitions to the third mode, it then determines whether an input signal is present at its second input 220, i.e., the latched output signal from the signal circuit 122. If so, then the processing circuit 112 determines that the meter cover 162 has been removed, or had been removed when the processing circuit 112 was in the sleep mode. In general, the processing circuit 112 records such an event in the memory 106, causes an indication of the event to be displayed on the display 111, and/or causes an indication of such event to be communicated remotely (if the meter 100 includes a remote communication device).

It will be appreciated that if the meter cover 162 is removed while the processing circuit 112 is in the sleep mode, and is replaced before the processing circuit 112 fully transitions to the active mode, then the signal circuit 122 no longer detects the closed circuit between the conductors 121a, 121b when the processing circuit 112 enters the active mode. However, in accordance with aspects of the embodiments described herein, the signal circuit 122 latches or holds the latched output signal active for a duration of time after the signal circuit 122 no longer detects the closed circuit between the conductors 121a, 121b. As a consequence, the processing circuit 112 nevertheless receives the latched output signal because signal circuit 122 sustains or latches the latched output signal for at least the duration of time it takes for the processing circuit 112 to transition from the sleep mode to the active (third) mode.

Accordingly, the mechanical activity detector 108 provides the advantage of being able to alert the processing circuit 112, while in sleep mode, of a tampering event (such as removal of the meter cover 162), and then retain an indicator signal (the latched output signal) for a sufficient amount of time to allow the processing circuit 112 to enter the active mode and detect the indicator signal. The processor 112a may suitably cause communication or display of the detected mechanical switch event upon full power up to active (first) mode when the power is restored to the power supply 124.

Figure 4:
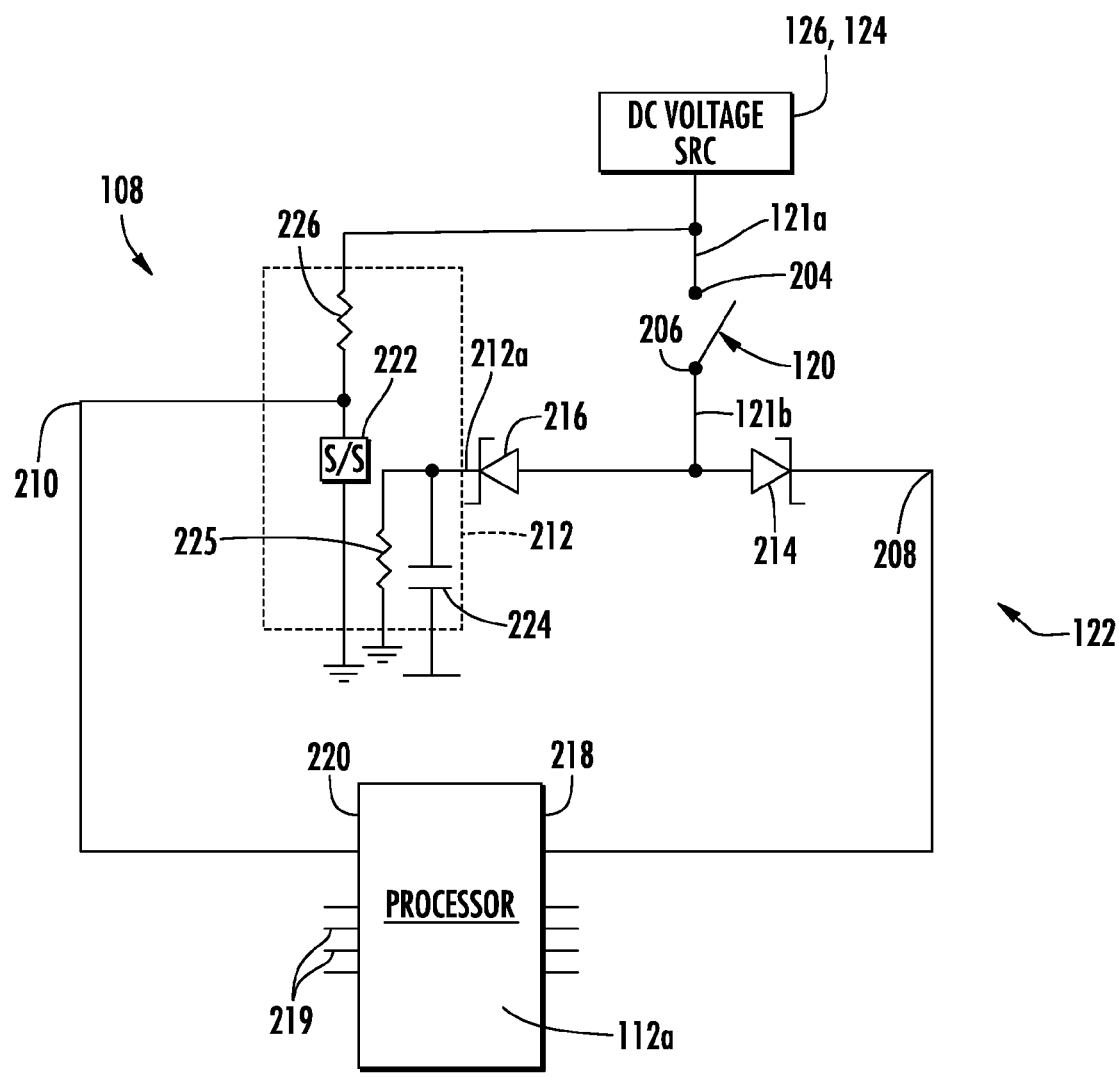
FIG. 4 shows in further detail a schematic block diagram of an arrangement for detecting and reporting mechanical activity of the meter of FIG. 1.

FIG. 4 shows in further detail a schematic block diagram of an arrangement 200 for detecting and reporting mechanical activity of the meter 100 of FIG. 1. The arrangement includes the mechanical activity detector 108 and the processor 112a. The mechanical activity detector 108 further includes the switch 120, the conductors 121a, 121b and the signal circuit 122.

As discussed, above, the processor 112a may suitably be a metering integrated circuit, such as a Teridian 71M6533 metering integrated circuit. The processor 112a includes a plurality of terminals 219 for data input and data output that may suitably be connected to various other elements in the meter 100, including the display 111, the memory 106, and the sensor circuit 110. At least one of the terminals 219 constitutes a power input for bias power from the primary power supply 124 and the secondary power source 126. In accordance with at least this embodiment, the processor 112a further includes a first input 218 configured to receive a wake-up or status change signal, and a second input 220 configured to receive a mechanical switch status signal. In addition to the traditional operations of the processor 112a, the processor 112a is configured to change from a sleep state to a third state responsive to receiving a high logic (or other similar) signal at the first input 218. The processor 112a is further configured to, when in the third state, store, display and/or communicate an event signal responsive to receiving a specific logic signal at the second input 220. In this embodiment, a low logic signal at the second input 220 corresponds to a closed switch 120, while a high logic signal at the second input 220 corresponds an open switch 120. The processor 112a is also configured to awaken and enter a first (normal metering) active state when it receives power from the first power supply 124.

The mechanical switch 120 includes a first contact 204 electrically coupled to the first conductor 121a and a second contact 206 electrically coupled to the second conductor 121b. As discussed above in connection with FIG. 1, the mechanical switch 120 is configured to switch to a closed state (electrically connecting its contacts 204, 206) when the cover 162 is removed from the meter base 160. The mechanical switch 120 is further configured to switch from a closed state to an open state (breaking the connection between contacts 204, 206) when the meter cover 162 is properly installed on the meter base 160. To this end, for example, the switch 120 in this embodiment is spring-loaded and normally biased in the closed position. The meter cover 162 could include a mechanical or physical feature that urges the switch 120 into the open position when the meter cover 162 is properly installed. Accordingly, whenever the meter cover 162 is removed, the mechanical switch 120 biases back to the closed position.

The signal circuit 122 includes a latch circuit 212, a first rectifier 214, a second rectifier 216, a first output 208 and a latched output 210. The latch circuit 212 is a circuit that is configured to receive a close signal indicative of a closure of the switch 120, and latch the signal in the high state for a predetermined amount of time. The predetermined amount of time corresponds to the time it takes for the processor 112*a* to transition from the sleep state to the active state. In this embodiment, the latch circuit includes a semiconductor switch 222, a capacitor 224, a discharge resistor 225, and a bias resistor 226, connected in a manner described further below.

Referring again generally to the arrangement 200, the first conductor 121*a* is operably connected to a source of DC bias power that provides power to the arrangement 200 regardless of whether the primary power supply 124 is in operation. Accordingly, the first conductor 121*a* is operably connected to at least the secondary power source 126, and preferably also the primary power supply 124. The second conductor 121*b* constitutes the switched output, and is operably connected to the first output 208 via the rectifier 214. In this embodiment, the rectifier 214 is a zener diode forward biased from the conductor 121*b* to the first output 208. The first output 208 is operably connected to the first input 218 of the processor 112*a*.

The second conductor 121*b* is further operably connected to the input 212*a*, which is also the input to the semiconductor switch 222, via the second rectifier 216. The second rectifier 216 may also be a zener diode, and is forward biased from the second conductor 121*b* to the input 212*a*. Referring to the latch circuit 212, the capacitor 224 is connected between the input 212*a* and circuit ground. The discharge resistor 225 is also connected between the input 212*a* and circuit ground. The capacitor 224 and discharge resistor 225 are selected to have a time constant sufficient to hold the voltage at the input 212*a* above the turn-on threshold of the switch 222 for at least the predetermined time that corresponds to the transition of the processor 112*a* from the sleep state to the active state. The predetermined time is between one and three seconds in this embodiment.

The bias resistor 226 is coupled between the DC bias power sources 124, 126 and the latch output 212*b*, which also forms the output terminal of the semiconductor switch 222. The semiconductor switch 222 also includes a terminal 212*c* coupled to circuit ground. In this embodiment, the semiconductor switch 222 is an FET device. The output 212*b* of the latch 212 is coupled to the latched output 210, which in turn is coupled to the second input 220 of the processor 112*a*.

In normal steady state operation, when the meter cover 162 is properly installed on the meter base, the switch 120 is in the open state. As a consequence, no voltage is present at the first output 208, or at the latch input 212*a*. Assuming steady state operation, the capacitor 224 is discharged. Accordingly, the switch 222 does not conduct, and the high logic voltage of the bias voltage source 124, 126 causes the latched output 210 to be in the high state. The high logic signal propagates from the output 210 to the input 220 of the processor 112*a*. If the processor 112*a* is currently in the sleep mode, as if due to a power interruption, then no signal at the input 220 is processed. If the processor 112*a* is in the normal active mode, then the processor 112*a* detects the high logic signal and does not process a cover removal event because the high logic signal indicates a normal condition of the cover 162.

If the meter cover 162 is removed, then the switch 120 changes to the closed state due to mechanical configuration as discussed above in connection with FIGS. 1 to 3. As a consequence, the bias voltage from the bias voltage source 124, 126 appears on the conductor 121*b*. This voltage, which is a high logic voltage, propagates both to the first output 208 and to the latch input 212*a*.

The high logic signal further propagates from the first output 208 to the first input 218 of the processor 112*a*. If the processor 112*a* is in the active mode, then the signal at the first input 218 has no effect. If, however, the processor 112*a* is in the sleep mode, then the signal at the first input 218 causes the processor 112*a* to transition to the active mode. Because power is not available to the processor 112*a* from the primary power supply 124 due to the power interruption, the processor 112*a* transitions to the active third mode as opposed to the normal active first mode.

Contemporaneously, as discussed above, the high logic voltage also appears at the latch input 212*a*. The voltage charges the capacitor 224 and turns on the semiconductor switch 222. The conducting semiconductor switch 222 pulls the output 212*b* low, thereby changing the latched output signal to a low logic signal. The latched output signal at the low logic signal propagates to the second input 220 of the processor 112*a*. If the processor 112*a* is in the active (first or third) mode, then the processor 112*a* detects the low logic voltage at the input 218 and processes an event responsive thereto. To process the event, the processor 112*a* stores a flag or other record of the event in memory, such as the memory 106. Alternatively, or in addition, the processor 112*a* may cause a display of an indication of the event on the display 111, and/or use a remote communication device (such as a pager radio or power line modem), not shown, to transmit a signal containing an indication of the event to a remote source.

Referring again to the processor 112*a*, it has been mentioned above that the processor 112*a* can take as much as a second or more to transition from the sleep mode to the active mode and process the input signal at the second input 218. Accordingly, there is a possibility that the cover 162 would be removed, and then replaced before the processor 112*a* can transition to the active mode and process the value at the input 218. In such a situation, however, the latch 212 holds the latched output signal at the output 210 at a low state for a sufficient time to allow the processor 112*a* to transition to the active state and process the value at the input 220. To this end, the capacitor 224 retains sufficient charge to hold the semiconductor switch 222 in the "on" state for at least the time associated with the transition of the processor 112*a* to the active third state (and whatever additional time is required to detect the value at the input 220). In such a case, even though the switch 120 may be open when the processor 112*a* processes the input signal at the input 220, the processor 112*a* still receives the low logic signal at the input 220 because the capacitor 224 has held the semiconductor switch 222 in the conducting state temporarily even though no voltage is present on the second conductor 121*b*.

As a consequence, even quick removal and replacement of the meter cover 162, even when the primary power to the meter 100 is absent, may be detected, recorded, displayed and/or communicated.

Figure 5:
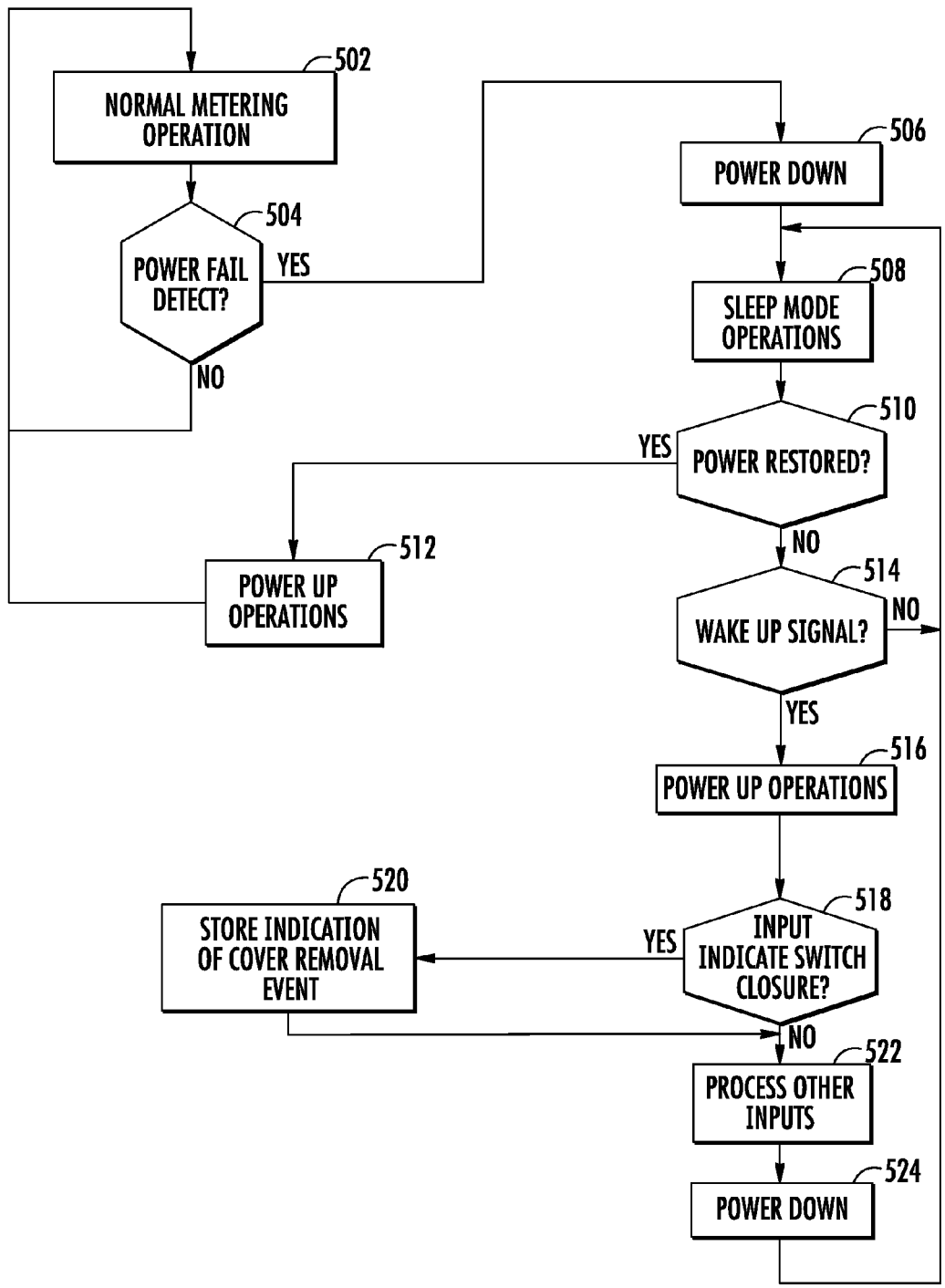
FIG. 5 shows a flow diagram of an exemplary set of operations of the processor of the meter of FIG. 1.

While the general operations of the processor 112*a* in connection with the arrangement 200 of FIG. 2 are discussed above, FIG. 5 shows a flow diagram of the steps of the processor 112*a*. Some of the individual steps of FIG. 5 represent generalized operations known in the metering art that can take many forms.

In step 502, the processor 112*a* operates in the active (first) mode to perform normal metering operations. As discussed above, such normal operations can involve performing metering calculations (i.e. determining energy consumption information from digital measurement data), control of the display 111, maintenance of a real-time clock, and the like. The operations of step 502 can also include detection of a closure of the switch 120 during active mode, as discussed above in connection with FIG. 4 In general, the operations of step 502 can include any useful meter processes.

In step 504, the processor 112a determines whether power from the primary power supply 124 has been interrupted, for example, due to a power line failure. To this end, the processor 112a may suitably have an input connected to a power failure detection circuit, not shown, that detects whether AC power is present and/or whether the power supply 124 is generating an output. An example of a suitable power failure detection circuit is shown, for example, in U.S. patent application Ser. No. 13/538,159, filed Jun. 29, 2012, which is owned by the owner of the present application and which is incorporated by reference herein. In any event, if the processor 112a determines that the power to/from the power supply 124 has been interrupted, it proceeds to step 506. If not, then the processor 112a continues normal metering operations in step 502.

In step 506, the processor 112a powers down and performs operations to transition from the active mode to the sleep or low power second mode. As discussed above, the various operations performed by a meter processing circuit upon transitioning to a low power mode or sleep mode would be known to those of ordinary skill in the art, and may suitably include storing metering values to the non-volatile memory 106. After step 506, the processor 112a proceeds to the sleep mode in step 508.

In sleep mode (step 508), the processor 112a maintains a real-time clock, and monitors the input at its first input 218. In the sleep mode, however, the CPU is turned off, and thus processor 112a does not execute programming instructions, access memory, or generate any outputs. Accordingly, among other things, the processor 112a does not perform any energy consumption calculations. As a consequence, the processor 112a consumes very little energy and can be powered by the secondary power source 126 for an extended amount of time in power outage. During the sleep mode, the processor 112a performs step 510.

In step 510, the processor 112a determines whether power has been restored to, or received from, the primary power supply 124. Effectively, voltage from the primary power supply 124 causes the processor 112a to activate. If power has been received from the primary power supply 124, then the processor 112a proceeds to step 512. If not, however, then the processor 112a continues in the sleep mode in step 514.

In step 512, the processor 112a performs power up operations, which includes turning on its internal oscillator circuit, allowing time for the oscillator circuit to stabilize, turning on the CPU, turning on appropriate peripherals, IOs, etc. The processor 112a thereafter proceeds to step 502 to perform metering operations. In addition in step 502, the processor 112a may determine whether the mechanical activity (i.e. cover removal event) flag had been set during the power outage, for example, as a result of a detected cover removal event. If so, then the processor 112a may cause a display of an indication of the event on the display 111, or cause the information to be communicated remotely if the meter 100 has such capability. In any event, after step 512, the processor 112a returns to the active (first) mode of step 502.

Referring again to the sleep mode if the answer in step 510 is in the negative, the processor 112a determines whether a "wake-up" signal or transition is received at the input 218. If not, then the processor 112a returns to continue the sleep mode operations in step 508.

However, upon receiving a high logic signal or positive transition at the first input 218, the processor 112a proceeds to step 516. In step 516, the processor 112a performs its start-up processes, which will vary from meter to meter, but typically will be similar to those of step 512, discussed above. In particular, the processor 112a turns on its internal oscillator circuit, allows time for the oscillator circuit to stabilize, turns on the CPU, and so forth. After step 516, the processor 112a is in an "active" mode, but only temporarily and for limited purposes. Thus, after step 516, the processor operates in the active third mode, but not the first mode in which normal metering operations take place. To this end, the processor 112a proceeds to step 518.

In step 518, the processor 112a polls one or more inputs, such as the input 220. In particular, in this embodiment, the processor 518 determines whether the input 220 is in a low logic level, indicating a cover removal event. As discussed above in connection with FIG. 4, the mechanical activity detector 108 provides a latched low logic signal to the second input 220 of the processor 112a if the switch 120 is closed. Otherwise, the logic signal at the second input 220 remains high. If the low logic signal is detected, then the processing circuit proceeds to step 520. If not, then the processor 112a proceeds directly to step 522.

In step 520, the processor 112a stores an indication of the cover removal event in the memory 106. The indication may suitably be an event record that includes a date and time stamp. The event record may then be subsequently displayed or communicated to an external device upon request, or otherwise in accordance with the operation of the processor 112a. In any event, after storing the cover removal event record or flag, the processor 112a proceeds to step 522.

In step 522, the processor 112a polls and processes other inputs, if appropriate. For example, the processor 112a in the third mode may also perform one or more other functions during a power outage upon receiving a wake-up signal. Such other functions can include providing a temporary display of metering values on the display 111 responsive to receiving an external switch input associated therewith. Further detail regarding such an operation is provided below in connection with FIGS. 6 and 7. It will be appreciated, however, that in some embodiments, the processor 112a does not process any other inputs and therefore step 522 is not necessary.

In any event, the processor 112a thereafter powers down to return to the sleep mode in step 524. Step 524 is similar to step 506, except that fewer values need be stored in the non-volatile memory 106 because no metering has taken place in steps 516 to 522. After step 524, the processor 112a resumes its sleep mode low power operations in step 508.

As discussed above in connection with step 522, in some embodiments, the meter 100 may further include an ability to provide meter displays during a power outage. In one example, which is described in my co-pending application Ser. No. 13/631,431, filed Sep. 30, 2012, which is owned by the assignee of the present invention and is incorporated by reference, discloses a meter having an arrangement for displaying metering information when power is absent from the primary power supply of a meter. Such an arrangement may readily be incorporated herein.

In general, such an alternative embodiment of the meter 100 would include a magnetic switch, such as a reed switch, that is coupled between at least the secondary power source 126 and the first input 218, and at least to another output of the processor 112a. During sleep mode, the closure of the magnetic switch, not shown in FIG. 1, would also cause the processor 112a to wake-up and perform operations. Such operations would involve checking the other input to which the magnetic switch is coupled. The processor 112a would detect the closure of the magnetic switch, and, responsive thereto, cause one or more metering values to be displayed on the display 111. Such operations could take place, for example, in step 522 of FIG. 5. Otherwise, the processor 112a would otherwise operate as discussed above.

This embodiment illustrates the way that a display operation may be activated temporarily on a meter that lacks primary power, combined with an operation that detects meter cover removal when the meter lacks primary power. Further detail regarding a specific embodiment of an arrangement for detecting mechanical switch and magnetic switch activity during a power outage is provided below in connection with FIG. 6.

Figure 6:
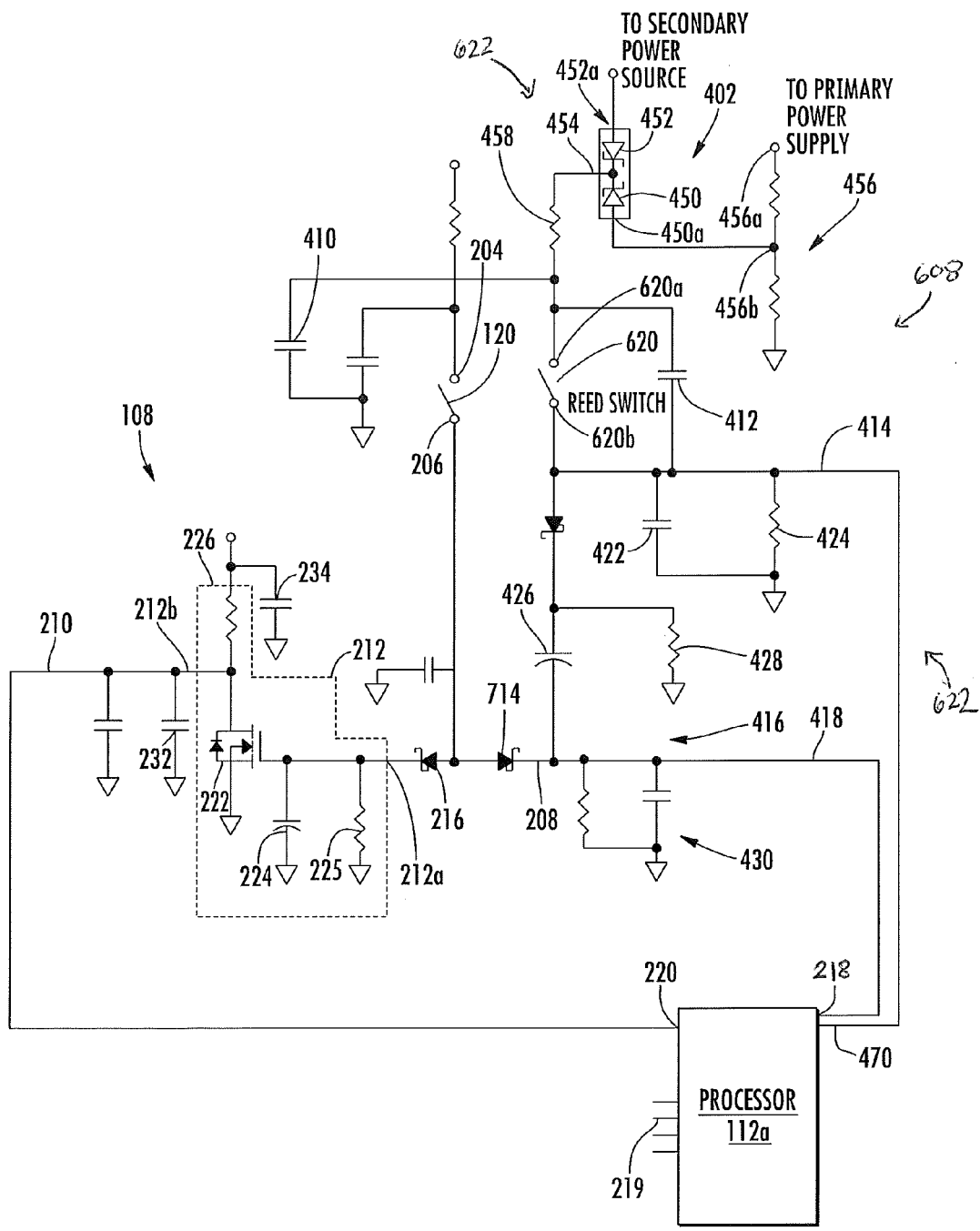
FIG. 6 shows a schematic block diagram of an alternative arrangement for detecting and reporting mechanical activity that further includes an arrangement for detecting a magnetic switch operation during power outage which may be used in an alternative version of the meter of FIG. 1.

To this end, FIG. 6 shows a schematic diagram of exemplary embodiments of the mechanical activity detector 108, a magnetic switch arrangement 608 and the processor 112a of an alternative embodiment of the meter 100 of FIG. 1 that further includes a display during power outage functionality. The mechanical activity detector 108 of FIG. 6 is preferably the same circuit as that shown in FIG. 4, and has substantially the same structure. Accordingly, the elements of the magnetic switch arrangement 108 bear the same reference numbers as the corresponding elements of FIG. 4. As discussed above, the first output 208 of the mechanical activity detector 108 is operably coupled to the first input 218 of the processor 112a, and the latched output 210 is coupled to the first input 220 of the processor 112a.

The magnetic switch arrangement 608 includes a magnetic switch 620 and a signal circuit 622. The magnetic switch 620 may suitably be a reed switch configured to be normally open, and actuable to the closed state by placement of a magnet or other magnetic field generating device in close proximity to the magnetic switch 620. The magnetic switch 620 is supported directly or indirectly on the meter base 160, and covered by the meter cover 162. Such reed switches, and their operation, are widely used in the metering art. As is known in the art, a technician may actuate a reed switch inside the meter cover 162 and/or inside the meter base 160 by placement of a magnetic device on the outside of the meter 100 near the location of the magnetic switch 620.

The signal circuit 622 in the embodiment is a circuit configured to, upon closure of the magnetic switch 620, produce a pulse signal at a first output 418. The signal circuit 622 also includes a second output 414 coupled to provide a steady state signal that is at a high logic level when the switch 620 is closed, and at a low logic level when the switch 620 is open.

As with the embodiment of FIG. 4, the processor 112a may suitably be a metering integrated circuit, such as a Teridian 71M6533 integrated circuit. The processor 112a includes a plurality of terminals 219 for data input and data output that may suitably be connected to various other elements in the meter 100, including the display 111, the memory 106, and the sensor circuit 110. At least one of the terminals 219 constitutes a power input for bias power from the primary power supply 124 and the secondary power source 129. In accordance with at least this embodiment, the processor 112a further includes the first input 218, the second input 220 and a third input 470 coupled to the second output 414 of the magnetic switch signal circuit 622. The processor 112a is configured to execute programming structures stored in the memory 106 to carry out the operations of FIG. 7, discussed further below.

Referring now to the magnetic switch arrangement 608 in further detail, the signal circuit 622 in this embodiment includes an OR circuit 402, the first output 418, the second output 414, a pulse circuit 416, a smoothing filter 430, and various RF suppression and filtering elements, including capacitors 410, 412 and 422, and the resistor 424.

In particular, a first contact 620a of the magnetic switch 620 is operably connected to the primary power supply 124 and secondary power supply 126 through the OR circuit 402. The OR circuit 402 is configured to provide bias power to the first contact 620a from the primary power supply 624 when the power supply 124 is operating, and to provide bias power to the first contact 620a from the secondary power source 126 when the primary power supply 124 is not operating. To this end, the OR circuit 402 includes two Schottky diodes 450, 452 connected to each other at their respective cathodes at an output node 454. In this embodiment, the OR circuit 402 further includes a voltage divider circuit 456 having an input 456a operably coupled to a five volt output of the primary power supply 124, not shown in FIG. 4, and an output 456b coupled to an anode 450a of the diode 450. The voltage divider circuit 456, which may suitably include a 1 k resistor coupled between the input 456a and the output 456b, and a 3.74 k resistor coupled between the output 456b and ground, is configured to provide a voltage at the output 456b that is just greater than that of the secondary power source 126.

The anode 452a of the diode 452 is coupled to a 3.6 volt secondary output of the secondary power source 126, not shown in FIG. 4. The output node 454 is coupled through a resistor 458 to the contact 620a of the switch 620. The resistor 458 may suitably be a 100 ohm resistor.

In this embodiment, the capacitor 410 is also coupled between the contact 120a and ground. The capacitor 410 has a value selected to aid in the suppression of relevant RF noise, and may suitably have a value of 330 pF. The capacitor 412 is coupled across the contacts 620a, 620b of the switch 620 for the purpose of RF suppression.

The contact 620b is further connected to the second output 414 of the signal circuit 622, which essentially provides a signal representative of the current state of the switch 620. The second output 414 is coupled to the second input 470 of the processor 112a. In this embodiment, a 330 pF capacitor 422 and a 100 k resistor 424 are coupled between the second output 414 and ground for the purpose of RF suppression.

The pulse circuit 416 is coupled between the second contact 620b of the switch 620, and the first output 418. The first output 418 is connected to the first input 218 of the processor 112a, not shown in FIG. 4. The pulse circuit 416 is configured to provide to the first output 418 a temporary pulse upon the transition of the switch 620 from the open to closed state. In this embodiment, the pulse circuit 416 includes one or more capacitors 426 having an effective capacitance of approximately 2 μF and a 100 k resistor 428. The smoothing filter 430 includes a resistor 432 and a capacitor 434, both coupled between the first output 418 and ground. The smoothing circuit 430 is configured to cooperate with the pulse circuit 416 to help shape the pulse provided to the first output 418.

In operation, the contact 620a receives a bias voltage from the OR circuit 402. In particular, if the primary power supply 124 is operating, then 5 volts appears at the input 456a of the voltage divider 456. As a result, the voltage at the output 456b will exceed the voltage at from the secondary power source 126, and the voltage at the output node 454 will be (approximately) the voltage divider output voltage. Alternatively, if the primary power supply 124 is not operating, then the 3.6 volts at the anode 452a from the secondary power source 126 is provided at the output node 454. Accordingly, regardless of whether the primary power supply 124 is operating, a bias voltage is present at the contact 620a of the switch 620.

In general, the operation of the mechanical activity detector 108 is substantially identical to that as discussed above in connection with FIG. 4. In particular, during normal metering operation, the processor 112a monitors and detects a transition to a low signal at its second input 220 to identify a cover removal (or other mechanical/tampering) event. During a power outage, with the processor 112a in sleep mode, the processor 112a is configured to detect any positive transition at the first input 218, and powers up to perform limited operations including determining whether the signal at the second input 220 is low, indicating a cover removal (or other mechanical/tampering) event.

Reference is now made to the operation of the magnetic switch arrangement 608. If the switch 620 is open, such as during normal operation with no magnet disposed proximate to the magnetic switch 620, then the open circuit created by the open magnetic switch 620 causes no voltage to be present at the output 414. Similarly, during steady state, the open state of the magnetic switch 620 causes no voltage to be provided at the first output 418.

From time to time, the switch 620 may be closed by operation of technician placing a magnetic device on or near the switch 620. In such a case, the positive voltage at the contact 620a propagates to the second contact 620b, and from there to the output 414. Accordingly, the processor 112a receives a high logic voltage from the switch contact 620b at the second input 470. The signal at the second output 414 remains at the high logic voltage until the switch 620 is opened.

Figure 8:
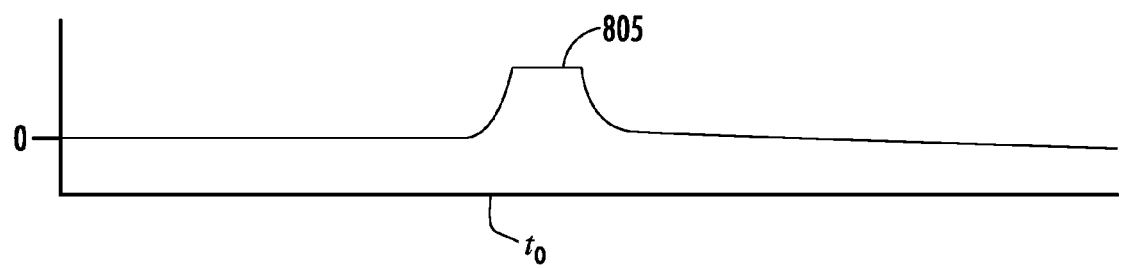
FIG. 8 is an exemplary timing diagram of a pulse signal generated by the arrangement for detecting a magnetic switch operation of FIG. 6.

In addition, the pulse circuit 416 generates a high logic pulse. To this end, at the moment of switch closure, the voltage at the contact 620b moves instantly toward the high logic voltage that is already present at the contact 620a. Because the voltage across the capacitor 426 cannot change instantaneously, the capacitor 426 passes, temporarily, the high logic voltage at the second contact 620b to the first output 418. After a brief time, the capacitor 426 discharges and acts as an open circuit between the second contact 620b and the first output 418. The smoothing circuit 430 works to elongate the pulse slightly by storing and slowly discharging the instantaneous pulse from the capacitor 426. The result is the pulse shown in FIG. 8. In particular, FIG. 8 shows a pulse 802 that occurs upon transition of the switch 120 from the open state to the closed state at time $t_0$. The pulse has a short duration, of on the order of 400 ms.

If the processor 112a is in the sleep mode when the pulse 802 is received, then it detects the pulse 802 at its first input 220. In response, the processor 112a powers up sufficiently to check, among other things, the value at the third input 470 (magnetic switch state), and the value at the second input 220 (mechanical activity switch state). The processor 112a in the temporarily powered up state then performs a predetermined display routine if the value at the third input 470 is a high logic level.

If, however, then processor 112a is already in the active state, such as during normal operation, then, in this embodiment, the processor 112a ignores the pulse from the first output 418. Instead, the processor 112a monitors the second output 414 on an ongoing basis during the active state. As a consequence, no "wake-up" pulse on the first output 418 is necessary.

Referring again to the processor 112a, it has been mentioned above that the processor 112a can take as much as a second or more to transition from the sleep mode to the active mode and process the input signals at the second input 220 responsive to a cover removal event. The processor 112a similarly requires approximately the same amount of time to process input signals at the third input 470 request a display. As further discussed above, the latch 212 operates to hold the latched output signal at the output 210 at a low state for a sufficient time to allow the processor 112a to transition to the active state and process the value at the input second input 220. To this end, the capacitor 224 retains sufficient charge to hold the semiconductor switch 222 in the "on" state for at least the time associated with the transition of the processor 112a to the on-state (and whatever additional time is required to detect the value at the second input 220). As a consequence, quick removal and replacement of the meter cover 162, even when the primary power to the meter 100 is absent, may be detected, recorded, displayed and/or communicated.

Moreover, it will be appreciated that the pulse circuit 416 helps the processor 112a detect a closing of the switch 120 by enabling the processor 112a to detect another transition at the first input 218 (e.g. due to a cover removal event) even when the magnetic switch 120 is closed. In particular, because closure of the magnetic switch 120 only causes a pulse output, as opposed to a constant high logic level output, at the first input 218, the processor 112a can still detect another transition at the first input 218 caused by closure of the mechanical switch 120 due to tampering, even when the magnetic switch 620 remains closed.

Figure 7:
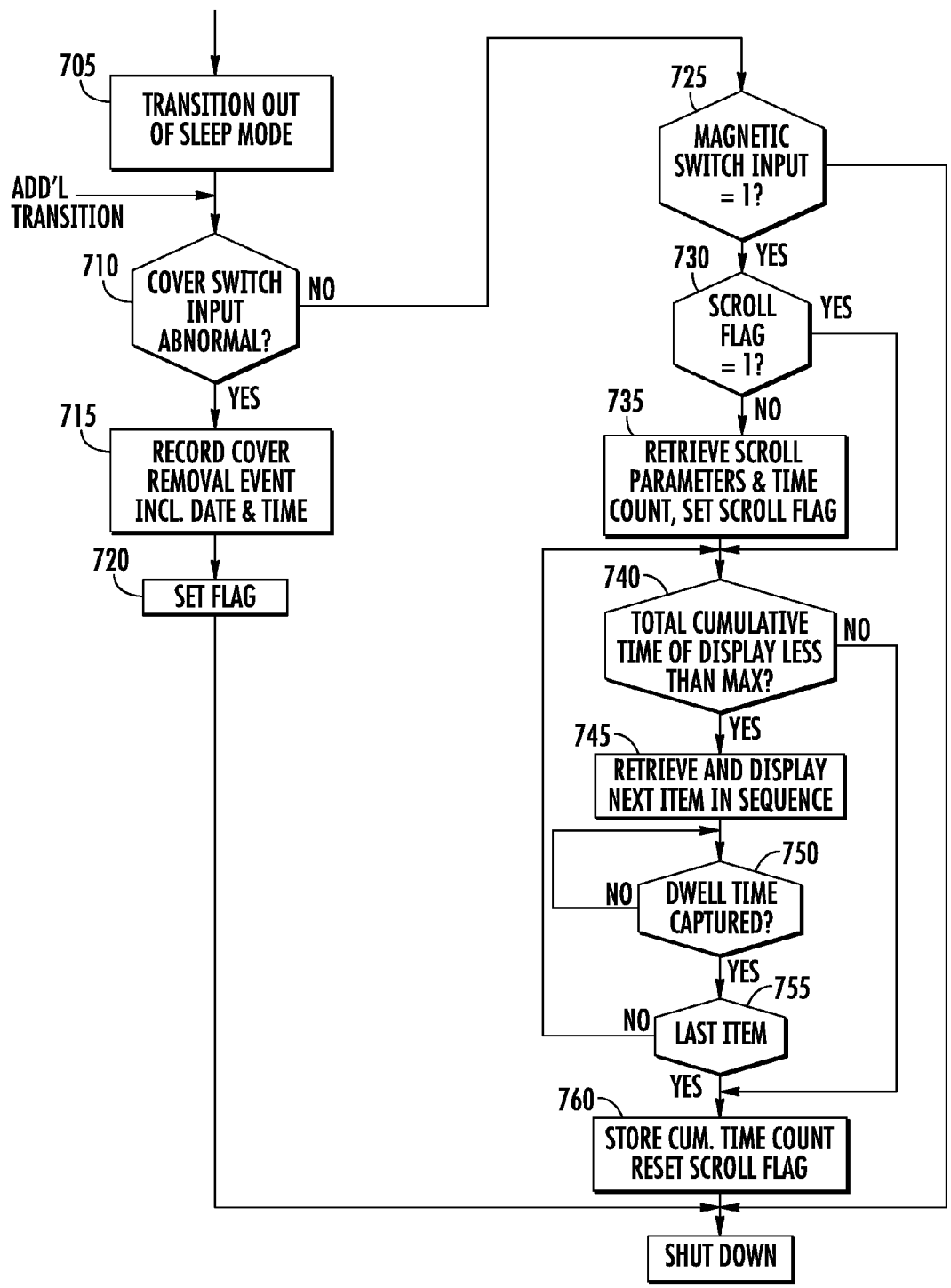
FIG. 7 shows a flow diagram of an exemplary set of operations of the processor of FIG. 6 when power is absent from the meter.

In particular, FIG. 7 shows a set of operations that may be commenced by the processor 112a when it is in sleep mode. In general, during the sleep mode, the processor 112a only maintains a real time clock, and monitors for a transition in the signal at its first input 218. The operations of FIG. 8 are only triggered when the processor 112a detects a positive transition in the signal at the first input 218.

Accordingly, in step 705, the processor 112a has detected the transition at the first input 218 during sleep mode. In step 705, the processor 112a transitions out of the sleep mode into a mode in which further programming instructions of FIG. 7 may be executed. To this end, as discussed above, during the sleep mode, the processor 112a does not execute any instructions, and only the real time clock is running to maintain the power consumption to its minimum. To transition out of sleep mode (due to a positive transition received at the first input 218), the processor 112a requires "warm up time" to turn on its internal oscillator circuit, wait time for the oscillator circuit to stabilize, turn on the CPU, turn on appropriate peripherals, IOs, etc. This process may take up to 1 second. Once the processor 112a has transitioned from the sleep mode to an active "third" mode in which programming instructions may be executed, the processor 112a proceeds to step 710.

In addition, if the processor 112a detects the transition at the input 218 while already executing the steps of FIG. 7, then the processor 112a proceeds directly to step 710. To this end, the processor 112a continues to monitor for transitions at the first input 218 while in the third mode, and upon detection of a transition, proceeds directly to step 710.

In step 710, the processor 112a identifies whether the signal at the second input 220 is in a logic state that indicates that the switch 120 is or has been closed within the last few moments (i.e. via operation of the latch circuit 212 of FIG. 7). In this embodiment, the processor 112*a* determines that the switch 120 is or has been recently closed if the signal at the input 220 is at the low logic level. If the signal at the input 220 is at the low logic signal level (indicating a switch 120 closure), then the processor 112*a* proceeds to step 715. If the signal at the second input 220 is at the high logic level (indicating no switch 120 closure), then the processor 112*a* proceeds instead to step 725.

In step 715, the processor 112*a* records a mechanical switch event record in the memory 106. The event record includes the time and date of the event, as well as an identification of the event. The processor 112*a* then proceeds to step 720. In step 720, the processor 112*a* sets a flag indicating that an event has occurred. The processor 112*a* may later use the flag as a trigger, when fully powered up (for normal metering operation), to display an indication of the cover removal event on the display 111, and/or communicate it using a meter communication circuit. After setting the flag, the processor 112*a* proceeds to shut down and return to sleep mode.

Accordingly, steps 715 and 720 indicate the operations that occur when the processor 112*a* detects a transition at the input 218 resulting from a closure of the switch 120. As discussed above, if processor 112*a* determines from the input 220 that the transition at the input 218 is not associated with the closure of the switch 120, then the processor 112*a* proceeds to step 725. In step 725, the processor 112*a* determines whether the third input 470 indicates that the magnetic switch 620 has been closed. If not, then the processor 112*a* shuts down and returns to sleep mode, as there is no indication of how the transition at the input 218 occurred.

If, however, in step 825 the processor 112*a* determines that the signal at the third input 470 is at a high logic level (indicating a closure of the magnetic switch 620), then the processor 112*a* proceeds to step 730. In step 730, the processor 112*a* determines whether the scroll flag has already been set. As will be discussed below, the scroll flag indicates whether the processor 112*a* was already executing the steps of FIG. 7.

If the scroll flag has already been set, then the processor 112*a* proceeds to step 740. If not, however, then the processor 112*a* first executes step 735. In step 735, the processor 112*a* retrieves display parameters from the memory 106. The display parameters identify the sequence of metering values that are to be displayed. To this end, it will be appreciated that the memory 106 stores several metering values that were stored to the memory 106 when the power outage occurred. These values may be displayed in sequence on the display 111. The memory 106 furthermore stores parameters identifying which of the stored values will be displayed, and in what order. The stored values that may be displayed include kWh, kVarh, kVAh, Max. demand, number of power outages, errors, tamper events, time and date, as well as others. Any or all of these may be displayed in any desirable order, as defined in the stored display parameters.

Also in step 735, the processor 112*a* obtains timing from the memory 106. The timing information is an accumulated count or measure of time time_count representative of the total time of display since the beginning of the present power outage. Furthermore, the processor 112*a* sets the scroll flag=1. While the scroll flag is set, the processor 112*a* adds to time_count, based on the internal clock, on an ongoing basis. In any event, after step 735, the processor 112*a* proceeds to step 740.

In step 740, the processor 112*a* determines if the value of time_count, which represents the total cumulative time of display during power outage, is below a predetermined threshold value. In particular, in order to ensure that the secondary power source 126 is not overused, the processor 112*a* allows for the display operation to take place only for a limit time. Accordingly, as long as time_count is below the threshold, the power outage display operation may continue. Otherwise, the processor 112*a* shuts down. In any event, if the processor 112*a* determines that time_count is below the threshold, then the processor proceeds to step 745. If time_count exceeds the threshold, then the processor 112*a* proceeds to step 760.

In step 745, the processor 112*a* retrieves from the memory 106 the next value to be displayed, as defined by the retrieved scroll parameters, and causes the value to be displayed on the display 111. The processor 112*a* then proceeds to step 750. In step 750, the processor 112*a* determines whether the dwell time of the display of the current value on the display 111 has expired. If not, then the processor 112*a* returns to step 750. If so, however, then the processor 112*a* proceeds to step 755.

In step 755, the processor 112*a* determines whether the current metering value being displayed is the last according to the parameters retrieved in step 735. If so, then the processor 112*a* proceeds to step 760. If not, however, then the processor 112*a* returns to step 740 and proceeds accordingly to display the next value in the defined sequence.

In step 760, the processor 112*a* stores the time_count value in the memory 106, and resets the scroll flag to 0. The processor 112*a* thereafter shuts down and goes into the sleep mode.

Thus, FIG. 7 illustrates some of the features of this embodiment in displaying metering information during a power outage. Firstly, the values are displayed in a sequence defined by display or scroll parameters stored in the memory 106. This allows the utility or other party to customize the sequence of values that are allowed to be displayed during power outage, by storing the parameters in memory 106. Secondly, while the display during power outage operation may be done repeatedly, the total accumulated display time during a single power outage may not exceed a predetermined threshold. This helps conserve energy in the secondary power source 126 for maintaining the clock and monitoring for tampering. Thirdly, this embodiment allows the user to rapidly scroll through the display sequence by repeated opening and closing of the magnetic switch 620 (by alternately placing and removing the magnetic device multiple times). To this end it will be appreciated that if the switch 620 and closed again, the processor 112*a* will detect the interrupt at the first input 218, and then perform steps 710, 725 and 730 again. However, in step 730, the processor 112*a* will determine that the flag had already been set and will skip forward to step 740 to move to the next value to be displayed.

Yet another feature of the embodiment of FIGS. 6 and 7 is that the processor 112*a* can detect a meter cover event even while performing display operations in steps 725-760.

It will be appreciated that the above described embodiments are merely illustrative, and that those of ordinary skill in the art may readily devise their own implementations and modifications that incorporate the principles of the present invention and fall with within the spirit and scope thereof.

What is claimed is:

1. A circuit arrangement for use in a utility meter;
a mechanical switch having a closed position and an open position, the mechanical switch configured to be at least temporarily in the closed position when a meter cover is moved, the mechanical switch configured to be in the open position when the meter cover is installed on the meter base, the mechanical switch operably coupled to generate a close signal when the mechanical switch is in the closed position;
a first circuit output operably coupled to receive the close signal;
a latch circuit operably coupled to receive the close signal, the latch circuit configured to generate a latched signal responsive to receiving the close signal, the latched signal latched for a predetermined time; and
a second circuit output operably coupled to receive the latched signal
wherein
the predetermined time corresponds to a wake-up time of a processing circuit, said wake-up time including at least time to power up an oscillator circuit of the processing circuit and at least time sufficient for stabilization of the oscillator circuit.

2. The circuit arrangement of claim 1, wherein the predetermined time corresponds to a wake-up time of a processing circuit.

3. The circuit arrangement of claim 1, wherein:
the mechanical switch includes a first contact and a second contact;
the first contact is operably coupled to a source of DC voltage; and
the mechanical switch is configured to electrically couple the first contact and the second contact when in the closed position, and to electrically decouple the first contact and the second contact when in the open position.

4. The circuit arrangement of claim 3, further comprising a first rectifier operably coupled between the second contact and the first circuit output.

5. The circuit arrangement of claim 3, further comprising a rectifier operably coupled between the second contact and the latch circuit.

6. The circuit arrangement of claim 5, wherein the latch circuit further comprises:
an input operably coupled to the second rectifier;
a capacitor coupled between the input and a reference voltage;
a semiconductor switch having a control terminal coupled to the input, and a first output terminal connected to the reference voltage, and a second output terminal connected to the second circuit output.

7. The circuit arrangement of claim 1, wherein the latch circuit further comprises:
an input operably coupled to receive the close signal;
a capacitor coupled between the input and a reference voltage;
a semiconductor switch having a control terminal coupled to the input, and a first output terminal connected to the reference voltage, and a second output terminal connected to the second circuit output.

8. The circuit arrangement of claim 7, further comprising a rectifier circuit operably coupled between the mechanical switch and the input.

9. The circuit arrangement of claim 7, wherein the semiconductor switch comprises a field effect transistor.

10. The circuit arrangement of claim 1, wherein:
the mechanical switch is configured to be at least temporarily in the closed position responsive to removal of the meter cover from a meter base.

11. A circuit arrangement for use in a utility meter;
a mechanical switch having a closed position and an open position, the mechanical switch supported by a meter housing, the mechanical switch operably coupled to generate a close signal when the mechanical switch is in the closed position;
a processor device having a first processor input and a second processor input, the first processor input operably coupled to receive the close signal, the processor device having an internal oscillator circuit;
a latch circuit operably coupled to receive the close signal and generate a latched signal responsive thereto, the latch circuit configured to latch the latched signal for a predetermined time, the predetermined time corresponding to a wake-up time of the processor device, the latch circuit operably coupled to provide the latched signal to the second processor input; and wherein said wake-up time including at least time to power up the internal oscillator circuit of the processing circuit and at least time sufficient for stabilization of the internal oscillator circuit.

12. The circuit arrangement of claim 11, wherein:
the mechanical switch includes a first contact and a second contact;
the first contact is operably coupled to a source of DC voltage; and
the mechanical switch is configured to electrically couple the first contact and the second contact when in the closed position, and to electrically decouple the first contact and the second contact when in the open position.

13. The circuit arrangement of claim 12, further comprising a first rectifier operably coupled between the second contact and the first processor input.

14. The circuit arrangement of claim 12, further comprising a second rectifier operably coupled between the second contact and the latch circuit.

15. The circuit arrangement of claim 11, wherein the latch circuit further comprises:
an input operably coupled to receive the close signal;
a capacitor coupled between the input and a reference voltage;
a semiconductor switch having a control terminal coupled to the input, and a first output terminal connected to the reference voltage, and a second output terminal connected to the second processor input.

16. The circuit arrangement of claim 15, further comprising a rectifier circuit operably coupled between the mechanical switch and the input.

17. The circuit arrangement of claim 16, wherein the processing device is configured to:
transition from a sleep mode to an active mode responsive to detection of a signal at the first processor input, the wake-up time defined as a duration of the transition;
detect in the active mode a signal at the second processor input; and
store information representative of the signal detected at the second processor input.

18. The circuit arrangement of claim 11, wherein the processing device is configured to:
transition from a sleep mode to an active mode responsive to detection of a signal at the first processor input;
detect in the active mode a signal at the second processor input; and
store information representative of the signal detected at the second processor input.

19. A method, comprising;
- employing a mechanical switch having a closed position and an open position to detect a physical condition of a utility meter while a processing device of the utility meter is in a sleep mode;
- providing a close signal using the mechanical switch in the closed position to a first processor input of the processing device;
- providing the close signal to a latch circuit;
- transitioning the processing device from the sleep mode to a different mode responsive to the close signal at the first processor input, said transitioning including powering up an oscillator circuit of the processing circuit and stabilizing of the oscillator circuit;
- using the latch circuit to generate a latch output signal responsive to the close signal, the latch output signal having a duration exceeding that of the close signal and exceeding a duration of the transitioning of the processing device from the sleep mode to the different mode;
- providing the latch output signal to the processing device.

20. The method of claim 19, wherein said transitioning further includes turning on a CPU of the processing circuit.

\* \* \* \* \*